United States Patent
Cobbley et al.

(10) Patent No.: US 7,423,331 B2
(45) Date of Patent: Sep. 9, 2008

(54) MOLDED STIFFENER FOR THIN SUBSTRATES

(75) Inventors: Chad A Cobbley, Boise, ID (US); Cary J Baerlocher, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/932,940

(22) Filed: Sep. 2, 2004

(65) Prior Publication Data

US 2005/0029549 A1 Feb. 10, 2005

Related U.S. Application Data

(62) Division of application No. 10/077,554, filed on Feb. 15, 2002.

(51) Int. Cl.
*H01L 23/497* (2006.01)

(52) U.S. Cl. ............... 257/667; 257/711; 257/E31.118

(58) Field of Classification Search ............... 257/676, 257/669, 672, 674, 782, 787, 707, 711, 668, 257/788, 666, E31.117, E31.118, E23.116, 257/667

See application file for complete search history.

(56) References Cited

U.S. PATENT DOCUMENTS

| | | | |
|---|---|---|---|
| 4,710,419 A | 12/1987 | Gregory | |
| 4,891,687 A | 1/1990 | Mallik et al. | 257/676 |
| 5,650,593 A | 7/1997 | McMillan et al. | |
| 5,929,517 A | 7/1999 | Distefano et al. | 257/707 |
| 5,973,389 A | 10/1999 | Culnane et al. | 257/678 |
| 6,020,221 A | 2/2000 | Lim et al. | 438/125 |
| 6,279,758 B1 | 8/2001 | Wark et al. | 211/41.17 |
| 6,284,569 B1 | 9/2001 | Sheppard et al. | 438/110 |
| 6,303,985 B1 | 10/2001 | Larson et al. | 257/676 |
| 6,326,544 B1 * | 12/2001 | Lake | 174/52.2 |
| 6,426,565 B1 | 7/2002 | Bhatt et al. | 257/783 |
| 6,440,777 B2 | 8/2002 | Cobbley et al. | 438/118 |
| 6,486,562 B1 | 11/2002 | Kato | 257/778 |
| 6,517,662 B2 | 2/2003 | Culnane et al. | 156/285 |
| 6,519,843 B2 | 2/2003 | Lauffer et al. | 29/840 |
| 6,584,897 B2 | 7/2003 | Cobbley et al. | 101/127 |
| 6,599,365 B1 | 7/2003 | Jiang et al. | 118/504 |
| 6,602,740 B1 * | 8/2003 | Mitchell | 438/127 |
| 6,724,071 B2 * | 4/2004 | Combs | 257/666 |

* cited by examiner

*Primary Examiner*—Howard Weiss
*Assistant Examiner*—Hoa B Trinh
(74) *Attorney, Agent, or Firm*—Whyte Hirschboeck Dudek SC

(57) ABSTRACT

A stiffener molded to a semiconductor substrate, such as a lead frame, and methods of molding the stiffener to the substrate are provided. The stiffener is molded to the substrate to provide rigidity and support to the substrate. The stiffener material can comprise a polymeric material molded to the substrate by a molding technique such as transfer molding, injection molding, and spray molding, or using an encapsulating material. One or more dies, chips, or other semiconductor or microelectronic devices can be disposed on the substrate to form a die assembly. The stiffener can be molded to a substrate comprising one or more dies, over which an encapsulating material can be applied to produce a semiconductor die package.

39 Claims, 6 Drawing Sheets

MOLDED STIFFENER FOR THIN SUBSTRATES

CROSS-REFERENCE TO RELATED APPLICATION

This application is a divisional of U.S. patent application Ser. No. 10/077,554, filed Feb. 15, 2002, which is incorporated herein by reference in its entirety.

FIELD OF THE INVENTION

The present invention relates generally to a stiffener for substrates used in semiconductor fabrication processes, and more particularly to a stiffener molded onto thin substrates, such as lead frames, used during the production of die assemblies and packages.

BACKGROUND OF THE INVENTION

A stiffener device has been used with lead frames for die assembly and package production to provide support for flexible, and even flimsy, substrates. The stiffener can assist in preventing or reducing damage to the substrate and associated electrical components. Stiffeners are typically attached to lead frames by applying a strip of adhesive tape or a layer of adhesive paste to the stiffener and/or the surface of the lead frame.

Referring to FIG. 1, a prior art semiconductor die package 2 disposed within a package mold 4 is shown. Package 2 typically comprises a lead frame 6 (or other substrate), adhesive element 8, one or more dies 10, adhesive element 12, a metal or plastic stiffener 14, and an encapsulating material 16. Package mold 4 comprises mold plates 18. Mold plates 18, as illustrated in FIG. 1, define a mold gate 20 and a cavity 22 disposed within package mold 4.

The package illustrated in FIG. 1 can be assembled by first constructing a die assembly 24. Die assembly 24 comprises one or more dies 10 secured to lead frame 6 with adhesive element 8. After die assembly 24 is assembled, plastic or metal stiffener 14 is secured to lead frame 6 of die assembly 24 with adhesive element 12, and the die assembly is placed between mold plates 18 within cavity 22. Encapsulating material 16 is then introduced into package mold 4, through mold gate 20, and flows over die assembly 24. In such instances, encapsulating material 16 is generally heated prior to being injected into package mold 4, and flowed in and around die assembly 24, covering all or a portion of lead frame 6 and/or dies 10. Thereafter, encapsulating material 16 is allowed to harden. Mold plates 18 can then be removed whereby package 2, as illustrated in FIG. 2, remains.

In some situations, the stiffener comprises a metal or metal alloy. Unfortunately, metal stiffeners are difficult to cut with conventional, diamond-tipped saws. As such, metal stiffeners are burdensome to segment before and during package production. Likewise, the produced packages that incorporate metal stiffeners are also difficult to cut. As a result, it is laborious to separate packages from one another. Additionally, metal stiffeners are expensive and therefore contribute to added expense of the package.

Plastic stiffeners have also been used to support a lead frame. Typically, in those cases where a plastic stiffener is used, a thermoplastic or thermosetting polymeric material is heated and introduced into a mold and, upon cooling, the mold is opened and a plastic stiffener is produced. Thereafter, the plastic stiffener is secured to the lead frame using an adhesive tape or paste.

Plastic stiffeners offer several advantages over metal stiffeners. For one, plastic stiffeners can be more easily cut. This allows the plastic stiffeners to be segmented and packages separated from one another. Also, plastic stiffeners are less expensive than metal stiffeners. As such, the cost of semiconductor processing can be reduced. However, plastic stiffeners, like their metal counterparts, have associated disadvantages.

For example, a supply of adhesive must be procured in order to attach the stiffeners to lead frames. Purchasing, inventorying, and storing the adhesive can add to the cost of die assembly and package processing. Further, attaching a stiffener requires an attachment step be performed during processing, which can require additional processing apparatus, add to processing time, and provide an opportunity for error. Therefore, an improved stiffener and method of applying the same to a substrate is desirable.

SUMMARY OF THE INVENTION

In one aspect, the invention provides a semiconductor device comprising a substrate and a stiffener molded to the substrate.

The stiffener can be molded to the substrate by various techniques such as transfer molding, injection molding, or spray molding. The stiffener can also be molded to the substrate with an encapsulating material. Advantageously, the molded stiffener can provide stiffening to the substrate, or increase the rigidity to the substrate.

The molded stiffener can comprise a thermoplastic or a thermosetting polymeric material. In addition, the thermal coefficient of expansion of the molded stiffener and the substrate can correspond such that heating expands both the molded stiffener and the substrate approximately equally. The molded stiffener can be sized to correspond to a length and/or a width of the substrate, or the substrate can be sized to correspond to a length and/or a width of the molded stiffener.

Further, the molded stiffener can include at least one cross member and be in the form of a grid, a lattice, a grille, or a web. In one embodiment, the molded stiffener can protrude from the surface of the substrate and, as a result, form an enclosure for receiving an encapsulating material. In another embodiment, a first surface of the substrate can include a recess formed in the substrate such that the stiffener can be molded to the substrate within the recess. Therefore, the molded stiffener can be flush with the first surface of the substrate.

The substrate can have a first stiffener molded to a first surface of the substrate and a second stiffener molded to a second surface of the substrate. In such an embodiment, the first stiffener and the second stiffener can comprise different configurations and/or dimensions. For example, the first stiffener can protrude from the first surface of the substrate and the second stiffener can be disposed within a recess in the second surface of the substrate.

Another aspect of the invention provides a semiconductor assembly. The semiconductor assembly can comprise a die disposed on a first surface of a substrate as well as a stiffener molded to the first surface of the substrate. In one embodiment, the semiconductor assembly can have a second stiffener molded to a second surface of the substrate and a second die disposed on the second surface of the substrate.

A further aspect of the invention provides a semiconductor die package. The die package can comprise a substrate having a die disposed on the substrate, a stiffener molded to the substrate, and an encapsulating material covering the die. The encapsulating material can be at least partially bounded by the molded stiffener. In one embodiment, the die package can include a second stiffener molded to a second surface of the substrate. The die package can be formed by a technique such as transfer molding.

Another aspect of the invention provides a method of securing a stiffener to a substrate. The method can comprise the steps of providing a stiffener material and a substrate, molding the stiffener material to the substrate, and permitting the stiffener material to harden to form a molded stiffener secured to the substrate. The step of molding can comprise transfer molding, injection molding, spray molding, or molding by applying an encapsulating material to the substrate. The stiffener material can harden by heating the stiffener material, permitting the stiffener material to cool, curing the stiffener material with a catalyst, or curing the stiffener material with exposure to radiation.

Another aspect of the invention provides a method of molding a stiffener to a lead frame assembly. The method can comprise the steps of providing a lead frame assembly, which includes a substrate and two or more die disposed on the substrate, providing a stiffener material, molding the stiffener material to the substrate to form a molded stiffener, and singulating the lead frame assembly, with the molded stiffener thereon, to separate the two or more die.

In one embodiment, prior to the singulation step, the method can comprise the step of encapsulating the two or more die disposed on the lead frame assembly. The encapsulating material can be dispensed onto the die such that the molded stiffener provides a boundary for containing the encapsulating material therein.

Another aspect of the invention provides a method of forming a semiconductor die package. The method can comprise the steps of securing a die to a substrate, molding a stiffener material to the substrate to form a molded stiffener thereon, and encapsulating the die and the molded stiffener with an encapsulating material to form the semiconductor die package. In one embodiment, the step of encapsulating can comprise inserting the substrate, with the die and the molded stiffener disposed thereon, into an opening between two mold plates. After the encapsulating material has hardened, newly formed package can be removed from the mold plates.

In another embodiment, the method of forming the die package can comprise the steps of mounting a die on a lead frame, molding a stiffener to the lead frame, applying an encapsulating material to the die and the stiffener, and permitting the encapsulating material to harden to produce the die package.

BRIEF DESCRIPTION OF THE DRAWINGS

Embodiments of the invention are described below with reference to the accompanying drawings and are for illustrative purposes only. The invention is not limited in its application to the details of construction or the arrangement of the components set forth in the following description or illustrated in the drawings. The invention is capable of other embodiments or of being practiced or carried out in other various ways. Also, it is to be understood that the terminology and phraseology employed herein is for the purpose of description and illustration and should not be regarded as limiting. Like reference numerals are used to indicate like components.

DETAILED DESCRIPTION OF THE PREFERRED EMBODIMENT

The invention will be described generally with reference to the drawings for the purpose of illustrating the present preferred embodiments only and not for purposes of limiting the same.

While the term "lead frame" is used as a preferred substrate in the several embodiments and figures to describe the invention, other substrates known in the microelectronics or semiconductor industry are contemplated for use with the invention. A non-exhaustive list of such substrates that can be used in the context of the invention includes a flexible laminated polymer or polyimide layer, a non-flexible material such as a bismaleimide triazine (BT) resin, an FR4 laminate, an FR5 laminate, a CEM1 laminate, a CEM3 laminate, a ceramic metal frame, among others. Further, the substrate used in the invention comprises a "thin" substrate which, as used herein, is defined as a substrate having a thickness of less than about seventy-five microns (75 μm).

Figure 3:
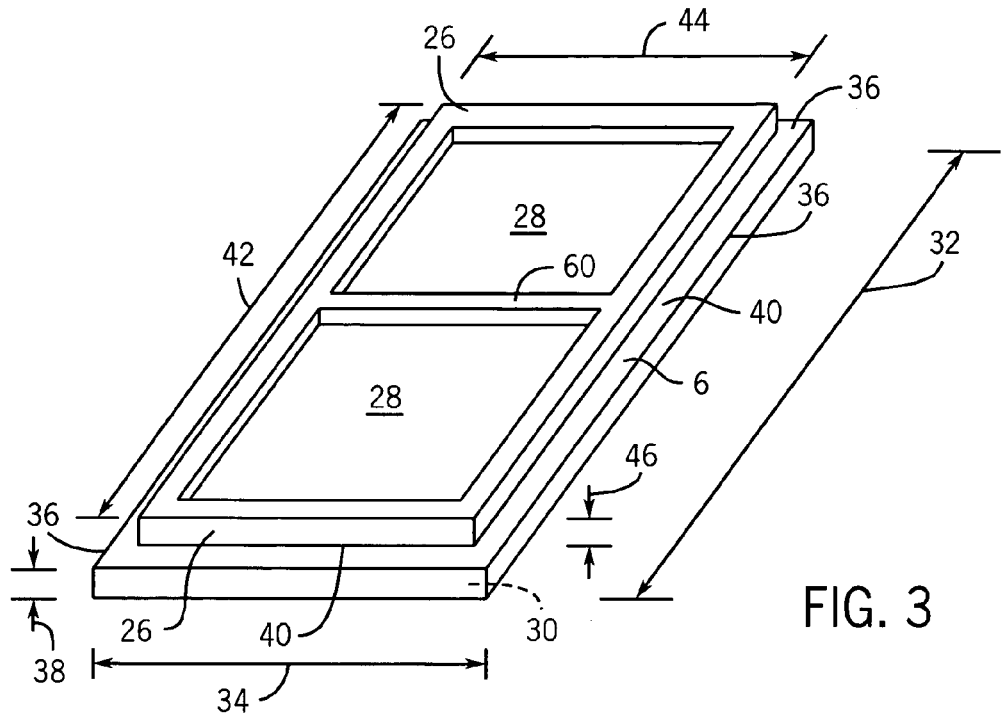
FIG. 3 is a perspective, top view of an embodiment of a molded stiffener according to the invention, disposed on a lead frame.

Turning to FIG. 3, an embodiment of a molded stiffener 26, according to the invention, associated with lead frame 6 is depicted. Lead frame 6 comprises a first surface 28, a second surface 30, a lead frame length 32, a lead frame width 34, leads frame edges 36, and a periphery 40 proximate the lead frame edges. Further, lead frame 6 comprises a "thin" substrate, and as such, has a thickness 38 of less than about seventy-five microns (75 μm). In one preferred embodiment, thickness 38 is less than about fifty microns (50 μm). In another preferred embodiment, thickness 38 is less than about thirty-five microns (35 μm).

Molded stiffener 26 comprises a stiffener length 42, a stiffener width 44, and a thickness 46. In preferred embodiments, thickness 46 of molded stiffener 26 is less than about one hundred microns (100 μm). In another preferred embodiment, thickness 46 is less than about seventy-five microns (75 μm). In yet another preferred embodiment, thickness 46 is less than about fifty microns (50 μm). Molded stiffener 26 can comprise a thermoplastic or thermosetting polymeric material such as epoxy.

Instead of molded stiffener 26 being secured to lead frame 6 using an adhesive element 12 (e.g., a strip of adhesive tape or a layer of adhesive paste) as used with prior art stiffeners, molded stiffener 26 can be molded directly to the lead frame. In one embodiment, molded stiffener 26 is molded to first surface 28 of lead frame 6 such that the molded stiffener extends or protrudes from the first surface as illustrated in FIG. 3. Likewise, in another embodiment, each of first surface 28 and second surface 30 can have molded stiffeners 26 disposed thereon. In yet another embodiment, molded stiffener 26 can be molded proximate edges 36 and/or periphery 40 of lead frame 6. The molding of molded stiffener 26 to lead frame 6 can be accomplished using a variety of known techniques.

Figure 1:
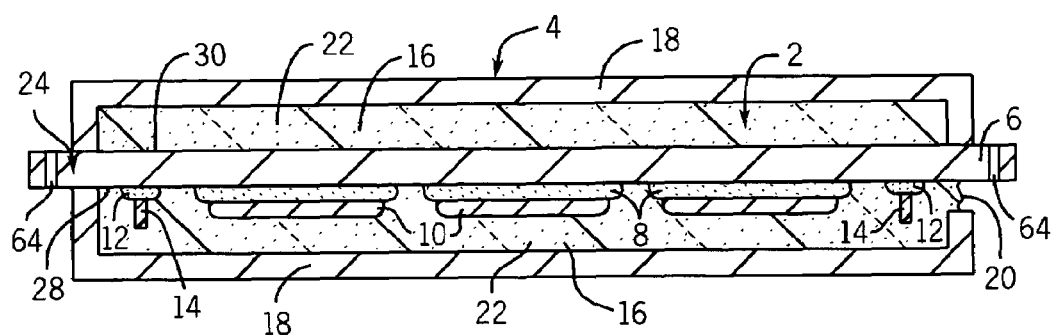
FIG. 1 is an elevational, end cross-sectional view of a package known in the art, disposed within mold plates and incorporating an attached plastic or metal stiffener.
Figure 2:
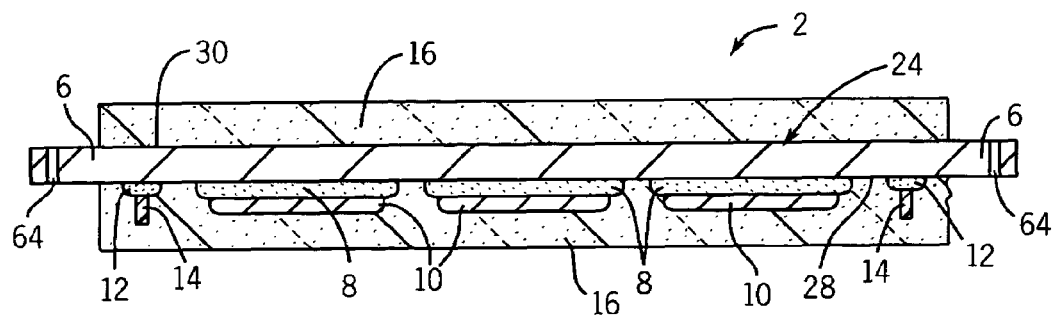
FIG. 2 is an elevational, end cross-sectional view of the prior art package of FIG. 1 with the mold plates removed.
Figure 4:
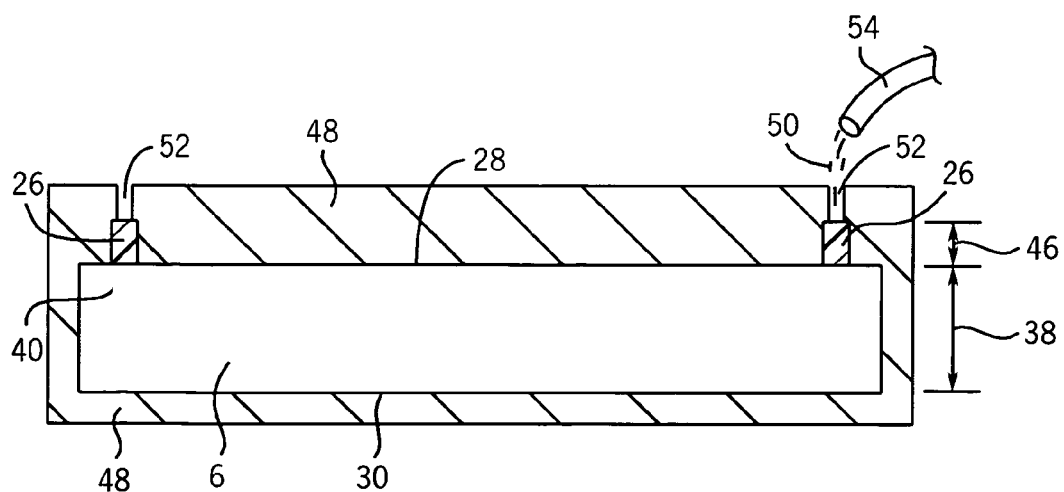
FIG. 4 is an elevational, end cross-sectional view illustrating an embodiment of a method according to the invention, wherein the molded stiffener of FIG. 3 is produced and secured to the lead frame using an injection molding technique.

In one embodiment of the invention, molded stiffener 26 is molded to lead frame 6 by injection molding as illustrated in FIG. 4. Fabrication of molded stiffener 26 by injection molding can be performed by placing a stiffener mold 48 corresponding to a desired design of molded stiffener 26 around lead frame 6 such that the lead frame is enveloped and enclosed by the stiffener mold. Thereafter, a heated, viscous stiffener material 50 (e.g., thermoplastic or thermosetting polymeric material) is injected into the stiffener mold 48 through mold gate 52 using an injection molding apparatus 54. Stiffener material 50 is subsequently allowed to harden, typically by heating, cooling, and/or curing. Hardening can also be accomplished by using an appropriate catalyst, such as an amine, and/or exposure to a radiation source, such as ultraviolet light (UV). The hardened stiffener material 50 is thus secured to (i.e., molded to), or within, lead frame 6. After hardening of molded stiffener 26, stiffener mold 48 can be removed such that lead frame 6, with molded stiffener 26 attached thereto, remains. Thus, molded stiffener 26 is secured to lead frame 6 without the need for a separate step involving the application of an adhesive element 12 (FIG. 1).

Figure 5:
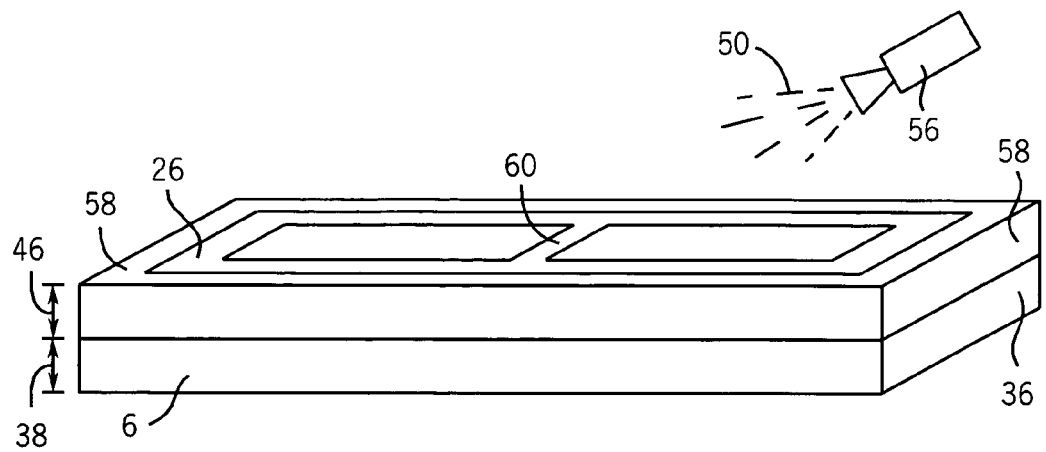
FIG. 5 is a perspective, top view illustrating another embodiment of a method according to the invention, wherein the molded stiffener of FIG. 3 is produced and secured to the lead frame by a spray molding technique that employs a template.

Besides injection molding, molded stiffener 26 can also be fabricated by spray molding stiffener material 50 onto lead frame 6, as illustrated in FIG. 5. By using a spray gun 56 or other like device capable of producing a spray, stream, mist, or the like, a viscous, flowable stiffener material 50, as described above, can be applied to the lead frame 6. To assist this process, a template 58 such as a mask, stencil, screen print, and the like, can be disposed upon lead frame 6. Stiffener material 50 can then be sprayed upon template 58 and exposed portions of lead frame 6. After stiffener material 50 has hardened, template 58 can be lifted away from lead frame 6 leaving behind molded stiffener 26 which has now been secured to lead frame 6.

Figure 6:
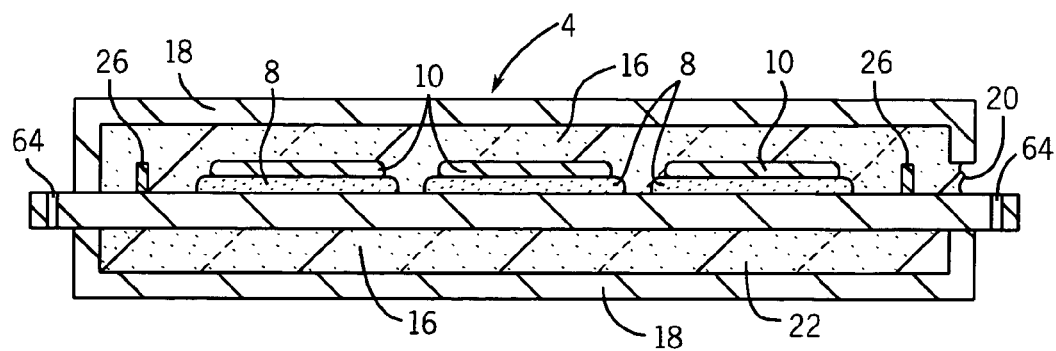
FIG. 6 is an elevational, end cross-sectional view illustrating another embodiment of a method according to the invention, wherein the molded stiffener of FIG. 3 is produced and secured to the lead frame by a transfer molding technique that employs an encapsulating material and mold plates.

In another embodiment of the method of the invention, as illustrated in FIG. 6, molded stiffener 26 can be molded onto lead frame 6 using a conventional encapsulating material 16 and mold plates 18 in a transfer molding process. In addition to protecting lead frames 6 and/or dies 10 from damage, encapsulating material 16 can be used to secure molded stiffener 26 to the lead frames. This method advantageously uses no adhesive 12 (FIG. 1) to secure molded stiffener 26 to lead frame 6.

Referring back to FIG. 3, as illustrated, molded stiffener 26 can also comprise cross member 60. Cross member 60 functions to provide additional support and rigidity to lead frame 6 in addition to the support provided by stiffeners known in the art lacking cross member 60. Despite molded stiffener 26 being depicted in FIG. 3 with one cross member 60, the molded stiffener can include several cross members and resemble a variety of shapes such as a grid, a lattice, a grille, a web, and the like. In other embodiments, molded stiffener 26 can also be disposed on surface 28 of lead frame 6 in the form of a strip, a plate, a ring, a rectangle, a square, an oval, and the like. In addition to the variety of shapes molded stiffener 26 can assume, the molded stiffener can come in various sizes (e.g., length 42, width 44, and thickness 46). Thus, the size and/or shape of molded stiffener 26 can be varied to correspond to the size and/or shape of lead frame 6 and die assembly 24.

Figure 7:
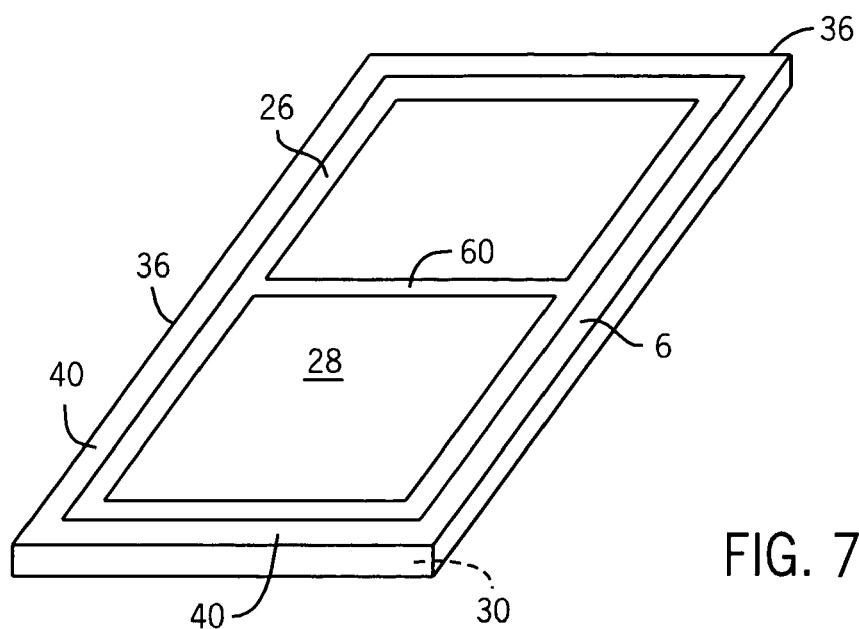
FIG. 7 is a perspective, top view of another embodiment of a molded stiffener according to the invention, incorporated and disposed within the lead frame.
Figure 8:
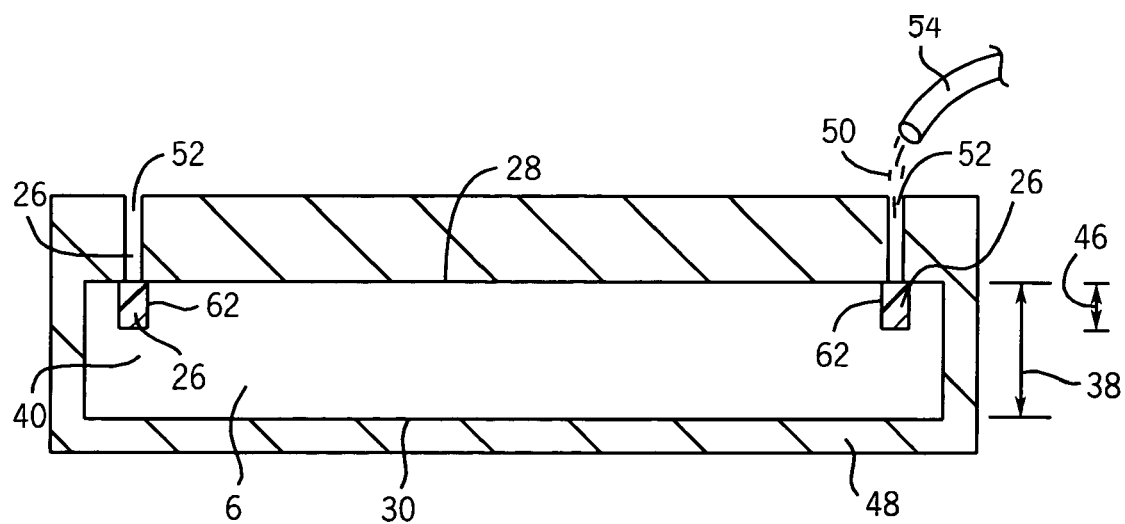
FIG. 8 is an elevational, end cross-sectional view illustrating an embodiment of a method according to the invention, wherein the molded stiffener of FIG. 7 is produced and secured to the lead frame using an injection molding technique.

As shown in FIG. 7, molded stiffener 26 can be integrally molded within the lead frame 6 structure such that the stiffener and the lead frame are flush-mounted together. In the embodiment of FIG. 7, stiffener material 26 can be injected or poured, as illustrated in FIG. 8, into an available recess 62 in lead frame 6 and then allowed to harden. Molded stiffener 26 can be molded within the structure of lead frame 6 during or after the manufacturing of the lead frame.

In each of the above embodiments, one benefit that molded stiffener 26 provides to lead frame 6 is rigidity and structural integrity, while still permitting flexibility. Further, in preferred embodiments, molded stiffener 26 and lead frame 6 have a coefficient of thermal expansion that is approximately equal. When the coefficient of thermal expansion for both molded stiffener 26 and lead frame 6 correspond, uneven expansion during the variety of heating, and cooling procedures involved in the fabrication of lead frames 6, die assemblies 24, packages 2, and other semiconductor or microelectronics, is avoided or reduced. Thus, stress at locations where molded stiffener 26 and lead frame 6 are molded together can be kept at a level sufficient to deter disengagement between the two components.

Figure 9:
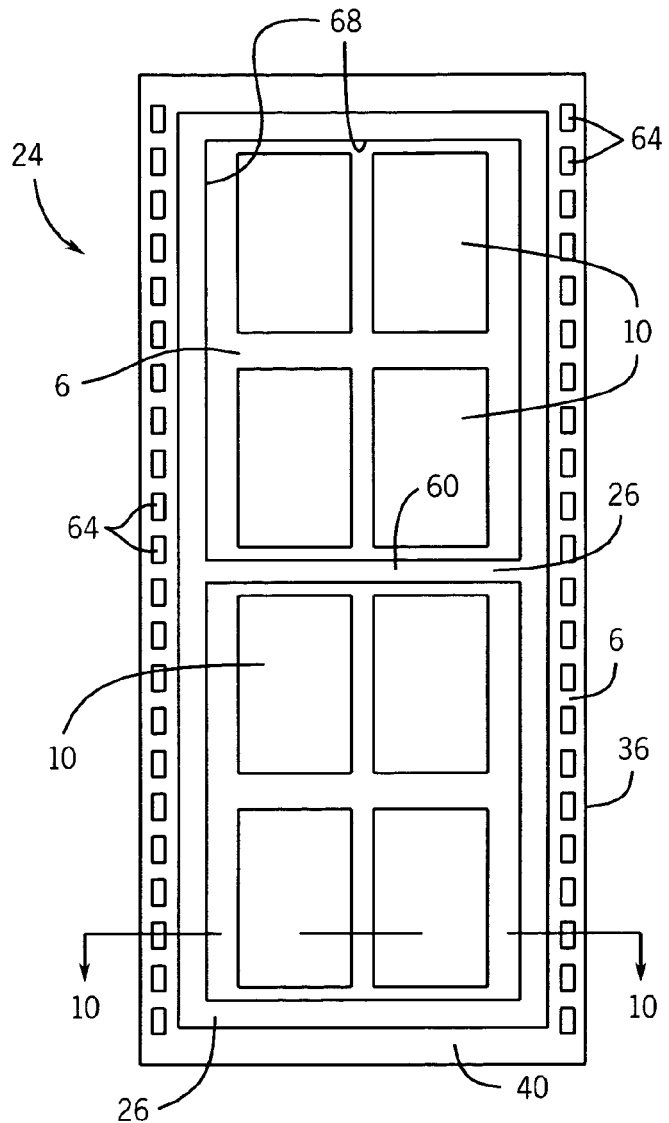
FIG. 9 is a top plan view of a lead frame assembly that comprises the molded stiffener of FIG. 3, as well as dies, secured to the lead frame and index holes disposed within the lead frame, the dies and index holes being shown relative to the molded stiffener.
Figure 10:
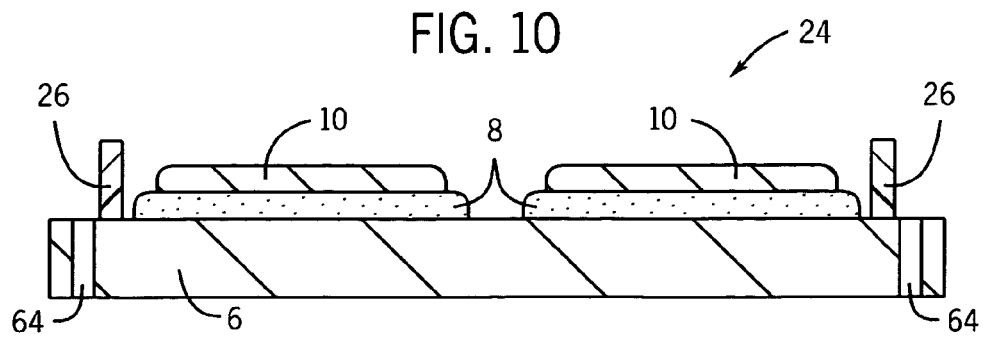
FIG. 10 is an elevational, end cross-section view of the lead frame assembly of FIG. 9 taken along line 10-10.

Turning to FIG. 9, an embodiment of a lead frame assembly 24 according to the invention is illustrated in detail. As previously stated, lead frame assembly 24 comprises lead frame 6 (or other substrate), the lead frame having one or more dies 10 disposed thereon. The methods of forming molded stiffener 26 on lead frame 6, as detailed above, are substantially the same as the methods of forming the molded stiffener on lead frame assembly 24, except that in the latter, the placement of dies 10 on the lead frame assembly is taken into account. In FIG. 10, a cross-section of lead frame assembly 24 of FIG. 9, taken along line 10-10, is illustrated to highlight molded stiffener 26 relative to the one or more dies 10 and lead frame 6. In preferred embodiments, lead frame assembly 24 further comprises a plurality of index holes 64 penetrating lead frame 6. Index holes 64, which can be penetrate lead frame 6 proximate periphery 40, permit conventional automated transfer mechanisms associated with chip bonders, wire bonders, molds, trim and form machinery, and other processing equipment to transport or handle lead frame 6, lead frame assembly 24, or package 66.

After desired components have been assembled to construct lead frame assembly 24, the lead frame assembly can be processed into semiconductor die packages 66, wherein lead frame assembly 24, or a portion thereof, is covered with encapsulating material 16. As previously stated, encapsulating material is typically used to protect die 10, lead frame 6, die assembly 24, integrated circuits, and other components from damage.

Figure 11:
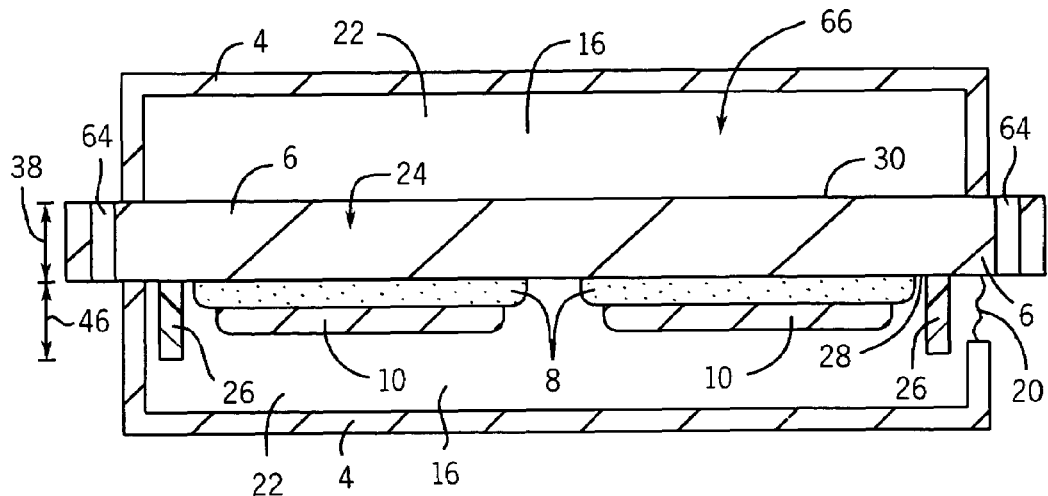
FIG. 11 is an elevational, end cross-section view of an embodiment of a package, according to the invention, incorporating the lead frame assembly of FIG. 9, the lead frame assembly being disposed within mold plates and encapsulated during a transfer molding process.

In one embodiment, as illustrated in FIG. 1, a conventional transfer molding process can be used to encapsulate lead frame assembly 24. In the transfer molding process, lead assembly 24 is placed within mold plates 18, as illustrated in FIG. 11. Thereafter, encapsulating material 16, which has typically been heated to provide a viscous, flowable liquid, is flowed under, over, and around lead frame 6, one or more dies 10, and/or molded stiffener 26. After encapsulating material 16 has hardened, mold plates 18 are removed to expose the resulting die packages 66.

Figure 12:
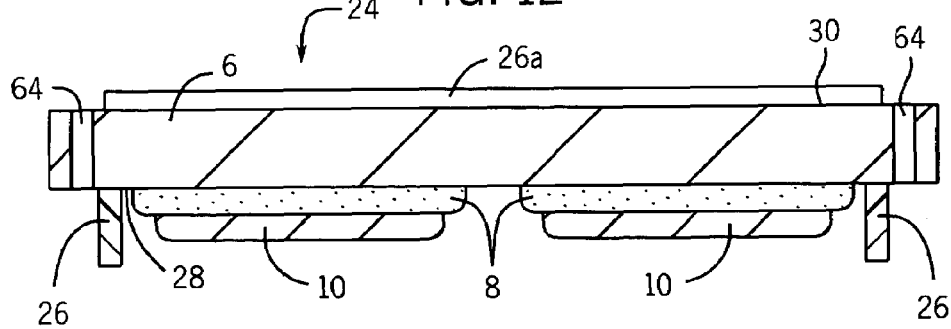
FIG. 12 is an elevational, end cross-section view of an embodiment of the lead frame assembly of FIG. 9 containing molded stiffeners of varying configurations disposed on opposing surfaces of the lead frame assembly.

In one embodiment, die package 66 can be fabricated from a lead frame assembly 24 that comprises two molded stiffeners 26, 26a on opposing surfaces (e.g., first surface 28 and second surface 30) of lead frame 6, as illustrated in FIG. 12. In one embodiment, the two molded stiffeners 26, 26a can comprise varying configurations and/or dimensions (e.g., length 42, width 44, and thickness 46). Two (or more) molded stiffeners 26, 26a can provide an extra measure of rigidity and support compared to the amount of rigidity and support provided by a lone stiffener. It is contemplated that a plurality of stiffeners can be disposed on lead frame 6 of lead frame assembly 24. Further, each of the plurality of stiffeners can comprise various configurations (e.g., size and/or shape).

Figure 13:
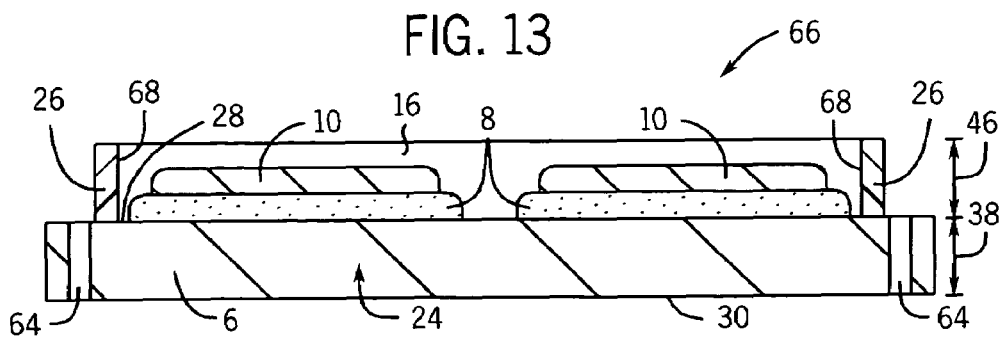
FIG. 13 is an elevational, end cross-section view of another embodiment of a package, according to the invention, incorporating the lead frame assembly of FIG. 9, the lead frame assembly employing a molded stiffener as a boundary for an encapsulating material applied to the lead frame assembly.

In another embodiment, as illustrated in FIG. 13, molded stiffener 26 can provide an enclosure or boundary 68 for encapsulating material 16, wherein package 66 can be made without using mold plates 18. In such cases, encapsulating material 16 is dispensed onto lead frame assembly 24 within boundary 68 of molded stiffener 26. Molded stiffener 26 functions to contain encapsulating material 16 within a confined area, resulting in package 66 as illustrated in FIG. 13.

In yet another embodiment, lead frame 6 can be configured to receive molded stiffener 26 thereon when the lead frame is in reel form (as opposed to being in strips). In these embodiments, a portion of the reel comprising lead frame 6 can be cut, truncated, singulated, separated, or otherwise partitioned into segments (not shown) before or after the molded stiffener has been molded onto the lead frame. In such embodiments, segments can be provided in order to ease or assist processing, provide one component (i.e., molded stiffener or lead frame) with dimensions that correspond to the dimensions of the other component. Segments can also be provided to separate components (e.g., die) disposed on die assembly 24 from each other. Unlike prior art stiffeners made of metal, molded stiffener 26 can be cut using conventional saw technology (e.g., diamond-tipped saw). Molded stiffener 26 can be cut separately, can be cut while disposed on lead frame 6, can be cut as a component of lead frame assembly 24, or can be cut as a component of package 66.

Despite the above methods being outlined in a step-by-step sequence, the completion of the acts or steps in a particular chronological order is not mandatory. Further, elimination, modification, rearrangement, combination, reordering, or the like, of the acts or steps is contemplated and considered within the scope of the description and claims.

While the present invention has been described in terms of the preferred embodiment, it is recognized that equivalents, alternatives, and modifications, aside from those expressly stated, are possible and within the scope of the appending claims.

In compliance with applicable statutes, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor die package, comprising:
   a substrate comprising a first surface, a second surface, and a periphery;
   a die situated on the first surface of the substrate within the periphery;
   a stiffener molded to the first surface of the substrate at about the periphery and flush with said first surface of the substrate, the stiffener secured to the substrate without adhesive attachment; and
   an encapsulating material covering at least a portion of the die.

2. The die package of claim 1, wherein the substrate is in a strip form.

3. The die package of claim 1, wherein the substrate is in a reel form.

4. The die package of claim 1, wherein the substrate comprises index holes.

5. A semiconductor die package, comprising:
   a substrate comprising a first surface, a second surface, and a periphery;
   a die situated on the first surface of the substrate within the periphery;
   a stiffener comprising a thermoplastic material molded to the first surface of the substrate at about the periphery and flush with said first surface of the substrate, the stiffener secured to the substrate without adhesive attachment; and
   an encapsulating material covering at least a portion of the die.

6. A semiconductor die package, comprising:
   a substrate comprising a first surface, a second surface, and a periphery;
   a die situated on the first surface of the substrate within the periphery;
   a stiffener comprising a thermoset polymeric material molded to the first surface of the substrate at about the periphery and flush with said first surface of the substrate, the stiffener secured to the substrate without adhesive attachment; and
   an encapsulating material covering at least a portion of the die.

7. A semiconductor die package, comprising:
   a substrate comprising a first surface, a second surface, and a periphery;
   a die situated on the first surface of the substrate within the periphery;
   a stiffener molded to the first surface of the substrate at about the periphery and flush with said first surface of the substrate, the stiffener secured to the substrate without adhesive attachment; and an encapsulating material covering at least a portion of the die;

wherein thermal coefficient of expansion of the molded stiffener and the substrate correspond such that heating expands both the molded stiffener and the substrate approximately equally.

8. A semiconductor die package, comprising:

a substrate comprising a first surface, a second surface, and a periphery;

a die situated on the first surface of the substrate within the periphery;

a stiffener injection molded to the first surface of the substrate at about the periphery and flush with said first surface of the substrate such that the stiffener is secured to the substrate without adhesive attachment; and an encapsulating material covering at least a portion of the die.

9. A semiconductor die package, comprising:

a substrate comprising a first surface, a second surface, and a periphery;

a die situated on the first surface of the substrate within the periphery;

a stiffener spray molded to the first surface of the substrate at about the periphery and flush with said first surface of the substrate such that the stiffener is secured to the substrate without adhesive attachment; and an encapsulating material covering at least a portion of the die.

10. A semiconductor die package, comprising:

a substrate comprising a first surface, a second surface, and a periphery;

a die situated on the first surface of the substrate within the periphery; and a stiffener molded to the first surface of the substrate by an encapsulating material covering at least a portion of the die, the stiffener flush with said first surface of the substrate and secured to the substrate without adhesive attachment.

11. A semiconductor die package, comprising:

a substrate comprising a first surface, a second surface, and a periphery;

a die situated on the first surface of the substrate within the periphery;

a stiffener molded to the first surface of the substrate at about the periphery and comprising at least one cross member, the stiffener flush with said first surface of the substrate and secured to the substrate without adhesive attachment; and an encapsulating material covering at least a portion of the die.

12. The die package of claim 11, wherein the stiffener is in a form selected from the group consisting of a grid, a lattice, a grille, and a web.

13. A semiconductor die package, comprising:

a die situated on a surface of a substrate;

a stiffener molded to and flush with the surface of the substrate and sized to correspond to at least one of a length and a width of the substrate, the stiffener secured to the substrate without adhesive attachment; and an encapsulating material covering at least a portion of the die.

14. A semiconductor die package, comprising:

a die situated on a surface of a substrate;

a stiffener molded to the substrate and forming an enclosure, the stiffener partially within a recess and flush with the surface of the substrate and secured to the substrate without adhesive attachment; and an encapsulating material situated within the enclosure and covering at least a portion of the die.

15. A semiconductor die package, comprising:

a substrate comprising a first surface, a second surface, and a periphery;

a die situated on the first surface of the substrate within the periphery;

a stiffener molded to the substrate and forming an enclosure about the die, the stiffener partially within a recess and flush with the first surface of the substrate and secured to the substrate without adhesive attachment; and an encapsulating material situated within the enclosure and covering at least a portion of the die.

16. A semiconductor die package, comprising:

a substrate comprising a first surface, a second surface, and a periphery;

a die situated on the first surface of the substrate within the periphery;

a stiffener integrally molded to and protruding from the first surface of the substrate, the stiffener partially within a recess and flush with the first surface of the substrate and secured to the substrate without adhesive attachment; and an encapsulating material covering at least a portion of the die.

17. A semiconductor die package, comprising:

a substrate comprising a first surface with a recess therein, a second surface, and a periphery;

a die situated on the first surface of the substrate within the periphery;

a stiffener situated in the recess and flush with the first surface of the substrate, and the stiffener molded to and secured to the first surface of the substrate without adhesive attachment; and an encapsulating material covering at least a portion of the die.

18. A semiconductor die package, comprising:

a substrate comprising a first surface, a second surface, and a periphery;

a die situated on the first surface of the substrate within the periphery;

a stiffener molded to and flush with the first surface of the substrate, the stiffener secured to the substrate without adhesive attachment; and an encapsulating material covering at least a portion of the die.

19. A semiconductor die package, comprising:

a substrate comprising a first surface, a second surface, and a periphery;

a die situated on the first surface of the substrate within the periphery;

a first stiffener molded to the first surface of the substrate;

a second stiffener secured to the second surface of the substrate; and an encapsulating material covering at least a portion of the die;

wherein at least one of the first and second stiffeners is flush with the first surface of the substrate and secured to the substrate without adhesive attachment.

20. A semiconductor die package, comprising:

a substrate comprising a first surface, a second surface, and a periphery;

a die situated on the first surface of the substrate within the periphery;

a stiffener molded to and secured to the first surface of the substrate without adhesive attachment, and the stiffener flush with the first surface of the substrate; and an encapsulating material covering at least a portion of the die and at least partially bound by the molded stiffener.

21. A semiconductor die package, comprising:

a substrate comprising first and second surfaces, and a periphery;

a die situated on the first surface of the substrate within the periphery;

a thermoplastic material molded onto the first surface of the substrate proximate the periphery to stiffen the substrate, the thermoplastic material secured to and flush with the first surface of the substrate without adhesive attachment; and an encapsulating material at least partially covering the die.

22. A semiconductor die package, comprising:

a substrate comprising first and second surfaces, and a periphery;

a die situated on the first surface of the substrate within the periphery;

a thermoset plastic material molded onto the first surface of the substrate proximate the periphery to stiffen the substrate, the thermoset plastic material secured to and flush with the first surface of the substrate without adhesive attachment; and an encapsulating material at least partially covering the die.

23. A semiconductor die package, comprising:

a substrate comprising first and second surfaces, a periphery, and a plurality of index holes along the periphery;

a die situated on the first surface of the substrate within the periphery;

a thermoset plastic material molded onto the first surface of the substrate proximate the index holes to stiffen the substrate, the thermoset plastic material secured to and flush with the first surface of the substrate without adhesive attachment; and an encapsulating material at least partially covering the die.

24. The die package of claim 23, wherein the substrate comprises a lead frame.

25. A semiconductor die package, comprising:

a lead frame comprising a first surface, a second surface, and a periphery;

a die situated on the first surface of the lead frame within the periphery;

a stiffener integrally molded to and flush with the first surface of the lead frame at about the periphery and secured to the substrate without adhesive attachment; and an encapsulating material at least partially covering the die.

26. A semiconductor die package, comprising:

a lead frame comprising a first surface, a second surface, and a periphery;

a die situated on the first surface of the lead frame within the periphery;

a first stiffener molded to the first surface of the lead frame at about the periphery;

a second stiffener molded to the second surface of the lead frame; and an encapsulating material at least partially covering the die;

wherein at least one of the first and second stiffeners is flush with the first surface of the lead frame and secured to the substrate lead frame without adhesive attachment.

27. A semiconductor die package, comprising:

a die situated on a surface of a substrate;

a stiffener molded to and secured to said surface of the substrate without adhesive attachment such that the stiffener is flush with said surface of the substrate; and an encapsulating material at least partially covering the die.

28. A semiconductor die package, comprising:

a die situated on a surface of a substrate having a periphery;

a stiffener molded to said surface at the periphery of the substrate and secured to said surface without adhesive attachment such that the stiffener is flush with said surface of the substrate; and an encapsulating material at least partially covering the die.

29. A semiconductor die package, comprising:

a die situated on a first surface of a substrate;

a stiffener molded to a second surface of the substrate such that the stiffener is flush with and secured to the second surface without adhesive attachment; and an encapsulating material at least partially covering the die.

30. A semiconductor die package, comprising:

a die situated on a first surface of a substrate having a periphery;

a stiffener molded to and flush with a second surface of the substrate at the periphery and secured to said surface without adhesive attachment; and an encapsulating material at least partially covering the die.

31. A semiconductor die package, comprising:

a die situated on a first surface of a substrate;

a first stiffener molded to the first surface of the substrate;

a second stiffener molded to a second surface of the substrate; and an encapsulating material at least partially covering the die;

wherein at least one of the first and second stiffeners is secured to the substrate without adhesive attachment, and at least one of the first and second stiffeners is flush with the first surface of the substrate.

32. A semiconductor die package, comprising:

first and second dies situated on opposing surfaces of a substrate;

a stiffener molded to each of the surfaces of the substrate, the stiffeners attached to said surfaces without adhesive attachment, and at least one of the stiffeners is flush with the surface of the substrate; and an encapsulating material at least partially covering the dies.

33. A semiconductor die package, comprising:

first and second dies situated on opposing surfaces of a substrate having a periphery;

a stiffener molded to each of the surfaces of the substrate at the periphery, the stiffeners attached to said surfaces without adhesive attachment, and at least one of the stiffeners is flush with the surface of the substrate; and an encapsulating material at least partially covering the dies.

34. A semiconductor die package, comprising:

a die situated on a surface of a substrate;

a stiffener molded to and flush with said surface of the substrate at least partially encircling the die, the stiffener attached to said surface without adhesive attachment; and an encapsulating material at least partially covering the die.

35. The die package of claim 34, wherein the encapsulating material is bounded by the stiffener.

36. A semiconductor die package, comprising:

a die situated on a surface of a substrate;

a stiffener molded to and flush with said surface of the substrate encircling the die, the stiffener attached to said surface without adhesive attachment; and an encapsulating material at least partially covering the die and bounded by the stiffener.

37. A semiconductor die package, comprising:

a die situated on a surface of a substrate; and a stiffener integrally molded to and flush with said surface of the substrate and attached to the substrate without adhesive attachment.

38. A semiconductor die package, comprising:

a die situated on a surface of a substrate; and a stiffener situated partially within a recess and flush with said surface of the substrate and attached to the substrate without adhesive attachment.

39. A semiconductor die package, comprising:

a die situated on a surface of a substrate; and a stiffener situated within a recess and flush with said surface of the substrate and attached to the substrate without adhesive attachment.

* * * * *